United States Patent
Lin

(10) Patent No.: US 6,226,185 B1
(45) Date of Patent: May 1, 2001

(54) HEAT SINK HAVING ANTI-ELECTROMAGNETIC WAVE DEVICE

(75) Inventor: Yu Chen Lin, Taipei (TW)

(73) Assignee: Asia Vital Components Co., Ltd., Taipei (TW)

( * ) Notice: Subject to any disclaimer, the term of this patent is extended or adjusted under 35 U.S.C. 154(b) by 0 days.

(21) Appl. No.: 09/449,823

(22) Filed: Nov. 26, 1999

(51) Int. Cl.[7] ............................... H05K 7/20; H05K 9/00
(52) U.S. Cl. ..................... 361/704; 176/35 R; 257/719; 361/818; 439/487
(58) Field of Search ................. 165/80.2, 80.3, 165/185; 174/16.3, 35 R; 257/707, 713, 718–719, 726–727; 361/704, 707, 709, 710, 715, 719, 720, 816, 818; 439/487

(56) References Cited

U.S. PATENT DOCUMENTS

| | | | |
|---|---|---|---|
| 5,241,453 | * 8/1993 | Bright et al. | 361/704 |
| 5,357,404 | * 10/1994 | Bright et al. | 361/818 |
| 5,771,960 | * 7/1998 | Lin | 361/704 |
| 5,864,464 | 1/1999 | Lin | 361/697 |

* cited by examiner

Primary Examiner—Gregory Thompson
(74) Attorney, Agent, or Firm—Charles E. Baxley

(57) ABSTRACT

A heat sink assembly includes a socket secured on a printed circuit board, an integrated circuit secured on the socket, a heat sink disposed on the integrated circuit, and a resilient retainer clip biasing the heat sink to engage with the socket. An anti-electromagnetic wave device includes a leg engaged with the printed circuit board and a head engaged through a lug of the socket and engaged with one arm of the resilient retainer clip for dissipating the electromagnetic wave that may be transmitted to the integrated circuit.

6 Claims, 4 Drawing Sheets

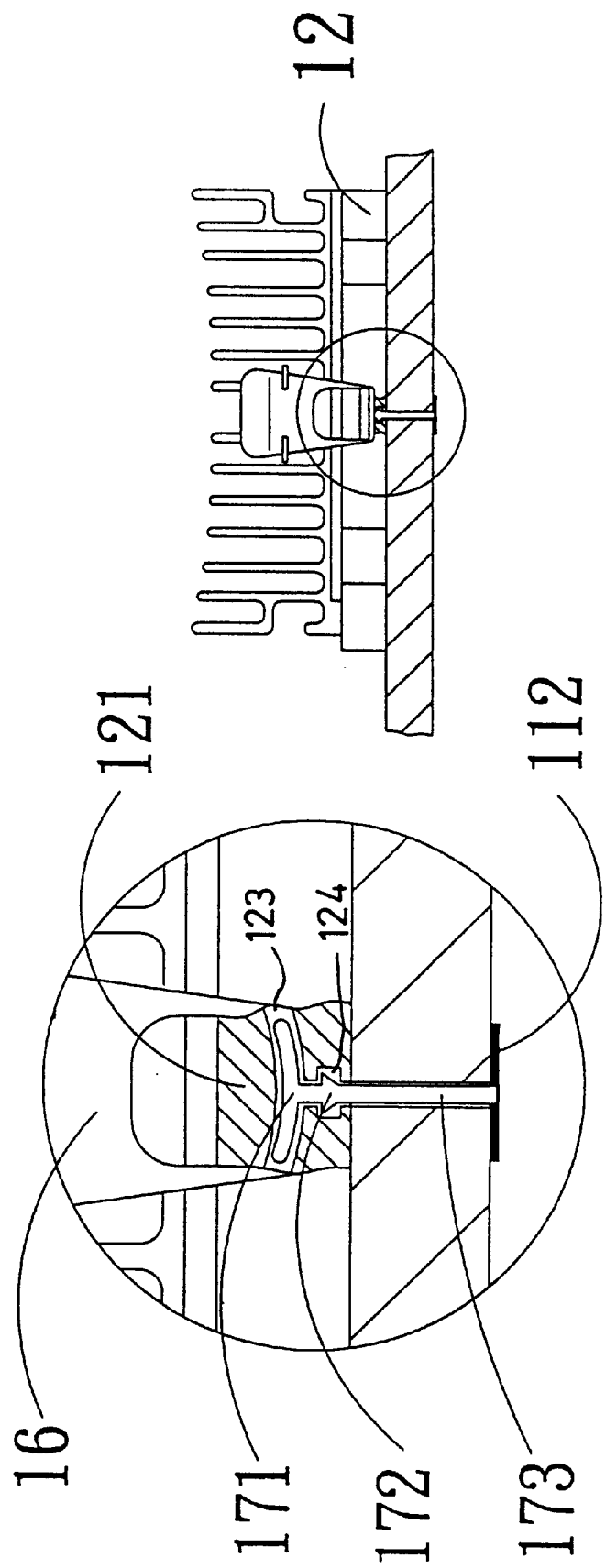

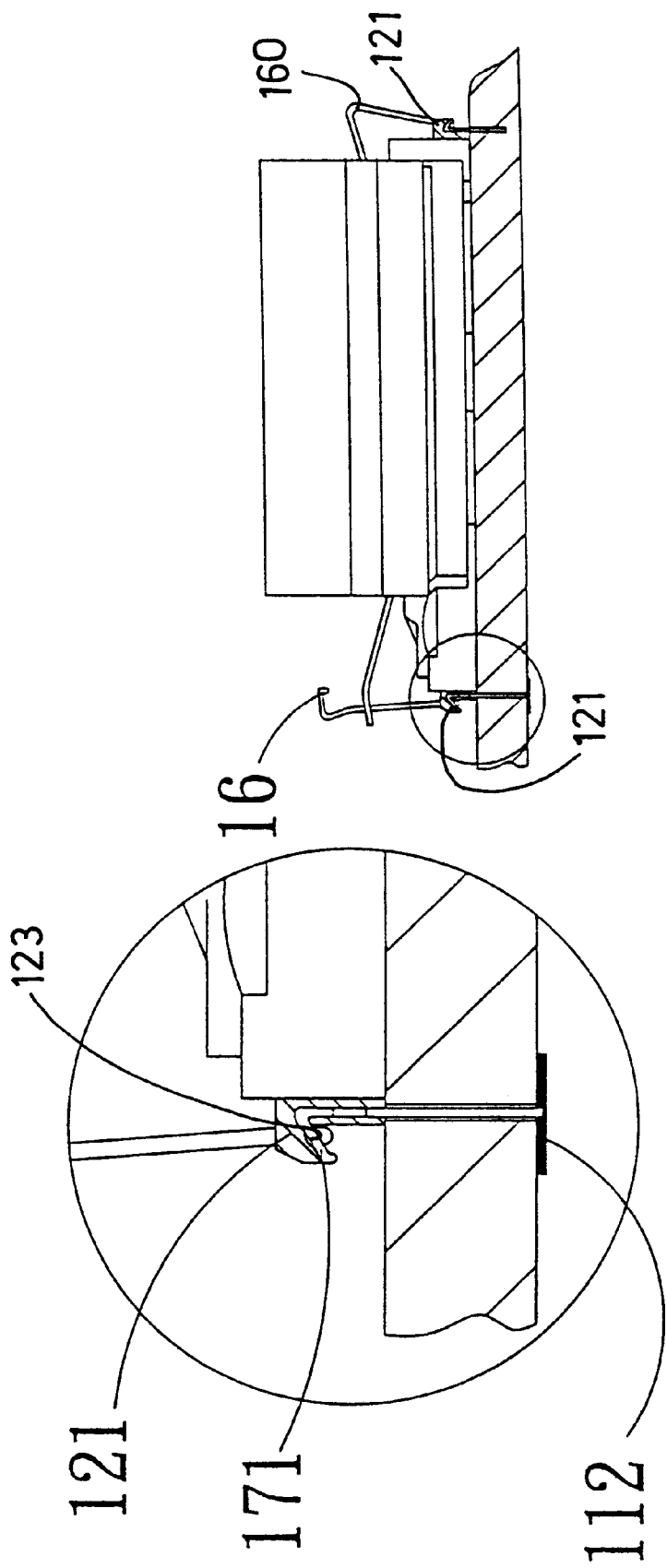

HEAT SINK HAVING ANTI-ELECTROMAGNETIC WAVE DEVICE

BACKGROUND OF THE INVENTION

1. Field of the Invention

The present invention relates to a heat sink, and more particularly to a heat sink having an anti-electromagnetic wave device.

2. Description of the Prior Art

Typical heat sinks are provided for dissipating the heat of the electric integrated circuits. The closest prior art of which the applicant is aware is his prior U.S. Pat. No. 5,864,464 to Lin and comprises a heat sink detachably secured to an integrated circuit with one or more fastener blades. The typical heat sinks have no device for anti-electromagnetic wave purposes.

The present invention has arisen to mitigate and/or obviate the afore-described disadvantages of the conventional heat sinks.

SUMMARY OF THE INVENTION

The primary objective of the present invention is to provide a heat sink assembly having an anti-electromagnetic wave device for preventing the integrated circuit from being interrupted by the electromagnetic wave.

In accordance with one aspect of the invention, there is provided a heat sink assembly comprising a printed circuit board, a socket secured on the printed circuit board, an apparatus secured on the socket, a heat sink disposed on the apparatus, a resilient retainer clip engaged with the heat sink and the socket for biasing the heat sink toward the socket, and means for dissipating electromagnetic waves.

The electromagnetic waves dissipating means includes an anti-electromagnetic wave device having a downwardly projecting leg engaged with the printed circuit board and having a head engaged with the resilient retainer clip. The socket includes at least one lug extended laterally therefrom, the resilient retainer clip includes at least one arm downwardly projected therefrom and engaged with the lug of the socket for biasing the heat sink toward the socket, the head of the anti-electromagnetic wave device is engaged with the arm of the resilient retainer clip.

The lug of the socket includes a groove formed therein, the head of the anti-electromagnetic wave device is bent from the anti-electromagnetic wave device and engaged through the groove of the lug of the socket and engaged with the arm of the resilient retainer clip.

A securing device may secure the anti-electromagnetic wave device to the lug of the socket and includes an aperture formed in the lug of the socket, and a latch formed on the anti-electromagnetic wave device and engaging with the aperture of the lug of the socket for securing the anti-electromagnetic wave device to the lug of the socket.

The printed circuit board includes a conductor secured thereto and engaged with the downwardly projecting leg of anti-electromagnetic wave device.

Further objectives and advantages of the present invention will become apparent from a careful reading of a detailed description provided hereinbelow, with appropriate reference to accompanying drawings.

BRIEF DESCRIPTION OF THE DRAWINGS

FIG. 3 is a partial cross sectional view of the heat sink assembly;

FIG. 4 is an enlarged partial cross sectional view taken along lines 4—4 of FIG. 1;

FIG. 5 is a partial cross sectional view taken along lines 5—5 of FIG. 1; and

FIG. 6 is an enlarged partial cross sectional view illustrating the anti-electromagnetic wave device for the heat sink assembly.

DETAILED DESCRIPTION OF THE PREFERRED EMBODIMENT

Figure 1:
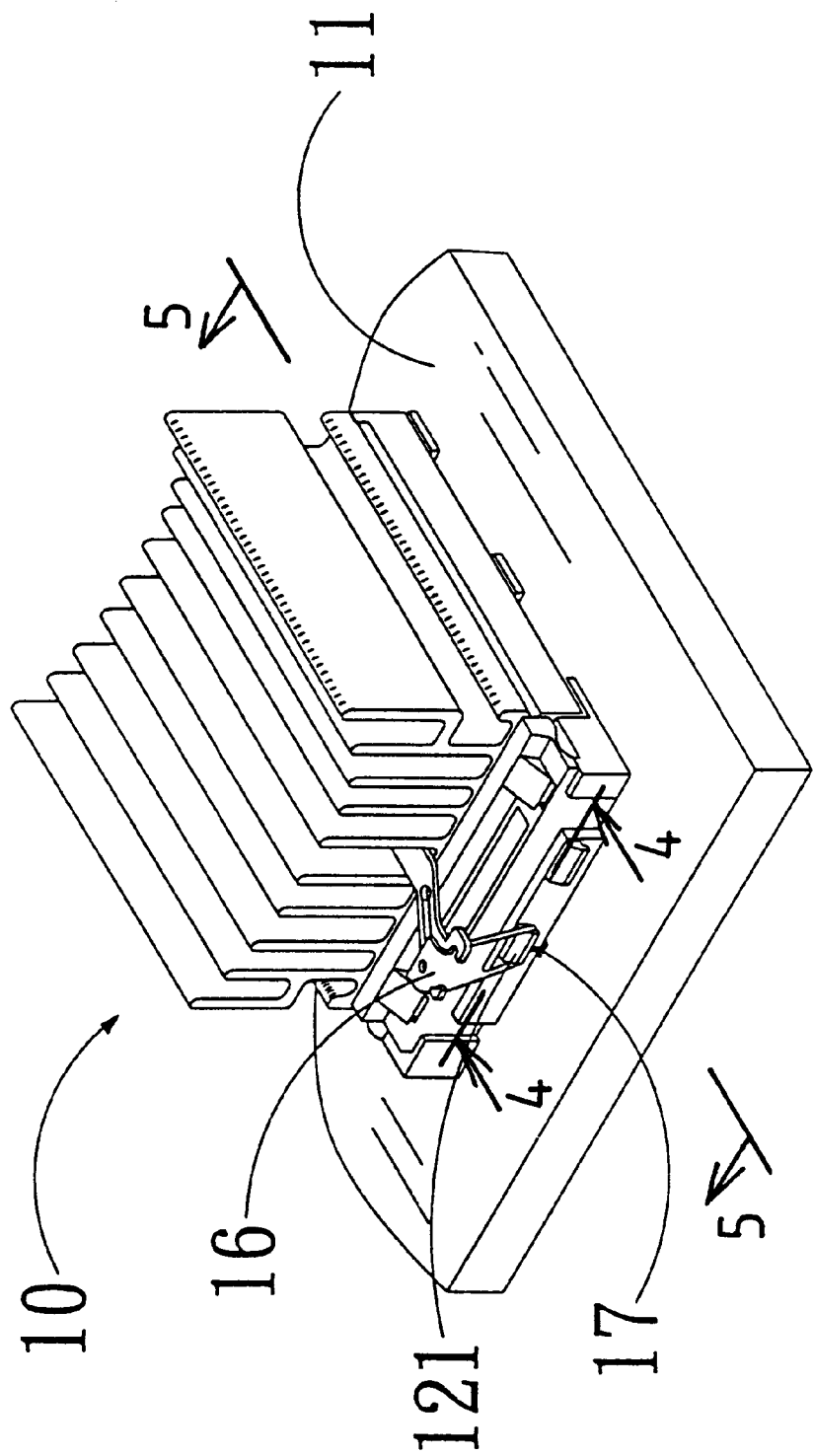
FIG. 1 is a perspective view of a heat sink assembly in accordance with the present invention.
Figure 2:
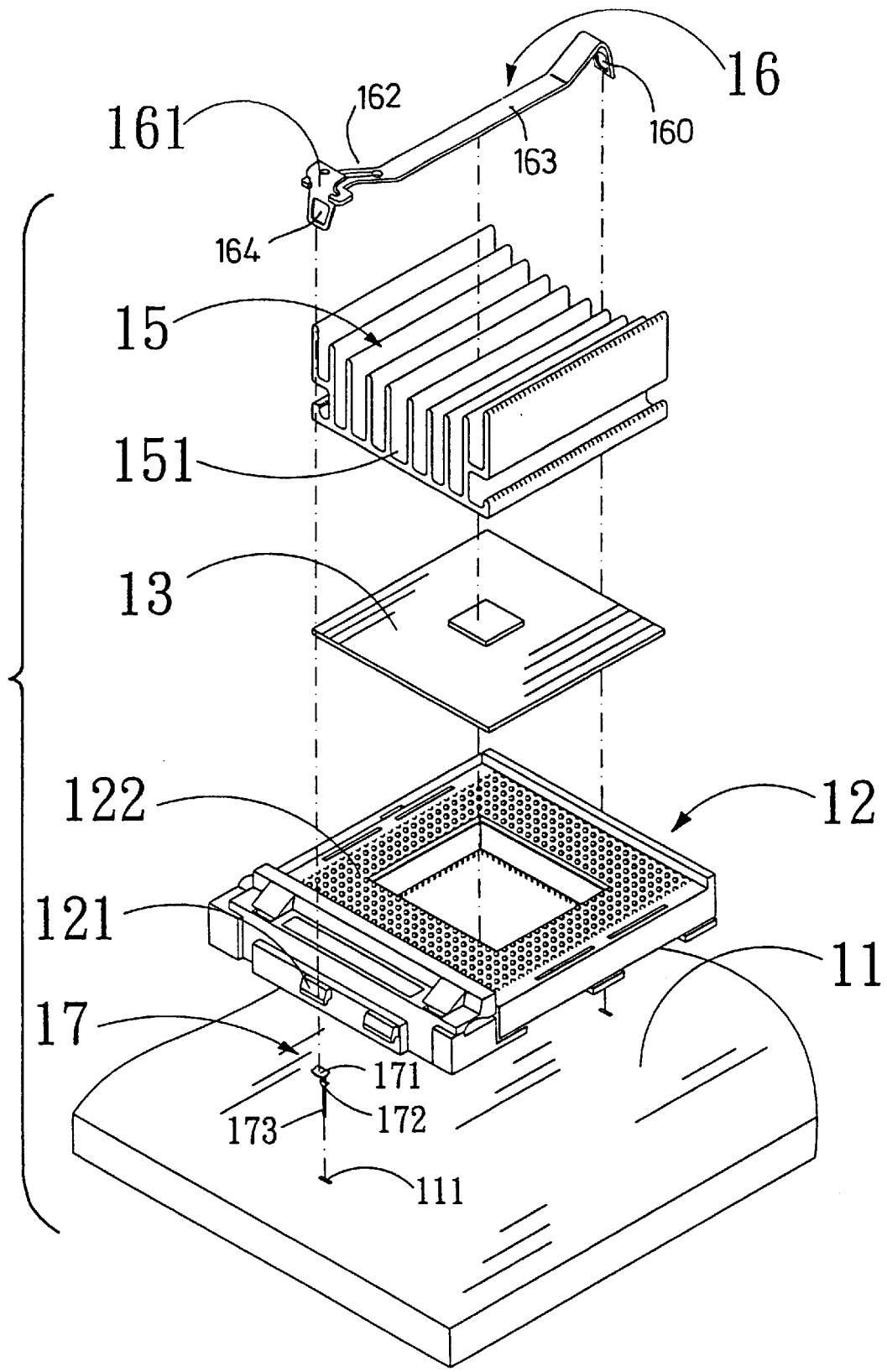
FIG. 2 is an exploded view of the heat sink assembly.

Referring to the drawings, and initially to FIGS. 1–3, a heat sink assembly in accordance with the resent invention comprises a printed circuit board 11 which may be of standard construction well known in the art. A socket 12, similar to the Socket 5 AMP socket but excluding some of the details of that socket, includes a number of typical pins (not shown) projecting downwardly for insertion into the typical holes (not shown) that are formed and provided in the printed circuit board 11. The socket 12 is generally rectangular, and includes two opposite side walls each having a lug 121 (FIG. 5) projecting laterally outward therefrom, and includes a number of holes 122 formed therein. An apparatus 13, similar to the Intel Pentium microprocessor, is mounted on the socket 12 by insertion of a number of pins (not shown) into the corresponding holes 122 in the socket 12.

A heat sink 15 may be of various constructions, but all heat sinks are fabricated or formed from a material with high thermal conductivity, such as Aluminum. The heat sink 15 includes a generally rectangular plate having a size co-extensive with the size of the apparatus 13, and includes a number of fins integral with the plate and formed from a single extrusion. In the central region of the heat sink 15, the fins are machined away from each other to create a channel 151 that extends across the plate. A resilient retainer clip 16 may be a one or more pieces construction having downwardly extending arms 160, 161 from a single top member 162 which includes a central biasing portion 163 for depressing or for biasing the heat sink into tight thermally conductive relation to the apparatus 13. The arms 160, 161 each includes an opening 164 for engaging the lugs 121 on the socket side walls and for biasing and securing the heat sink 15 to the apparatus 13 and the socket 12.

The heat sink assembly in accordance with the present invention further comprises an anti-electromagnetic wave device 17 including a downwardly projecting leg 173 engaged into the corresponding orifice 111 that is formed in the printed circuit board 11. The anti-electromagnetic wave device 17 includes a head 171 bent or laterally projected from the upper portion thereof, and includes a latch 172 provided in the middle portion thereof. Referring to FIGS. 3–6, one of the lugs 121 of the socket 12 includes a groove 123 and an aperture 124 (FIG. 4) formed therein for receiving the head 171 and the latch 172 of the anti-electromagnetic wave device 17 respectively. The engagement of the latch 172 of the anti-electromagnetic wave device 17 into the aperture 124 of the lug 121 may secure the anti-electromagnetic wave device 17 to the lug 121. The head 171 of the anti-electromagnetic wave device 17 is engaged through the groove 123 of the lug 121 and is extended below the lug 121 (FIG. 6) for engaging with the arm 161 of the resilient retainer clip 16. An electric conductor and/or a heat conductive member 112 is further provided and attached to the bottom of the printed circuit board 11 and is coupled to the leg 173 of the anti-electromagnetic wave device 17.

It is to be noted that the anti-electromagnetic wave device 17, the resilient retainer clip 16 and the heat sink 15 are made of electric conductor and/or heat conductive materials.

The electromagnetic waves that may be generated by the apparatus 13 or that may be transmitted to the apparatus 13 may be transmitted to and dissipated via the heat sink 15 and the resilient retainer clip 16 and the anti-electromagnetic wave device 17 and/or the electric conductor and/or a heat conductive member 112, such that the apparatus 13 will not be interfered by the electromagnetic waves.

Accordingly, the heat sink assembly includes an anti-electromagnetic wave device for preventing the integrated circuit from being interrupted by the electromagnetic wave.

Although this invention has been described with a certain degree of particularity, it is to be understood that the present disclosure has been made by way of example only and that numerous changes in the detailed construction and the combination and arrangement of parts may be resorted to without departing from the spirit and scope of the invention as hereinafter claimed.

I claim:

1. A heat sink assembly comprising:

a printed circuit board, a socket secured on said printed circuit board, an apparatus secured on said socket, a heat sink disposed on said apparatus, a resilient retainer clip engaged with said heat sink and said socket for biasing said heat sink toward said socket, and means for dissipating electromagnetic waves, wherein said electromagnetic waves dissipating means includes an anti-electromagnetic wave device having a downwardly projecting leg engaged with said printed circuit board and having a head engaged with said resilient retainer clip.

2. The heat sink assembly according to claim 1, wherein said socket includes at least one lug extended laterally therefrom, said resilient retainer clip includes at least one arm downwardly projected therefrom and engaged with said at least one lug of said socket for biasing said heat sink toward said socket, said head of said anti-electromagnetic wave device is engaged with said at least one arm of said resilient retainer clip.

3. The heat sink assembly according to claim 2, wherein said at least one lug of said socket includes a groove formed therein, said head of said anti-electromagnetic wave device is bent from said anti-electromagnetic wave device and is engaged through said groove of said at least one lug of said socket and is engaged with said at least one arm of said resilient retainer clip.

4. The heat sink assembly according to claim 2 further comprising means for securing said anti-electromagnetic wave device to said at least one lug of said socket.

5. The heat sink assembly according to claim 4, wherein said securing means includes an aperture formed in said at least one lug of said socket, and a latch formed on said anti-electromagnetic wave device and engaging with said aperture of said at least one lug of said socket for securing said anti-electromagnetic wave device to said at least one lug of said socket.

6. The heat sink assembly according to claim 1, wherein said printed circuit board includes a conductor secured thereto and engaged with said downwardly projecting leg of anti-electromagnetic wave device.

* * * * *